United States Patent [19]
Jouvenel et al.

[11] Patent Number: 5,676,863
[45] Date of Patent: Oct. 14, 1997

[54] INDUCTION PLASMA TORCH

[75] Inventors: Bernard Jouvenel, Bures sur Yvette; Pierre Ripoche, Pithiviers, both of France

[73] Assignee: Alcatel Fibres Optiques, Bezons Cedex, France

[21] Appl. No.: 501,295

[22] Filed: Jul. 12, 1995

[30] Foreign Application Priority Data

Jul. 22, 1994 [FR] France ................................. 94 09106

[51] Int. Cl.$^6$ ............................................. B23K 10/00
[52] U.S. Cl. ........................... 219/121.52; 219/121.48; 219/121.43; 315/111.51
[58] Field of Search .................... 219/121.43, 121.44, 219/121.48, 121.52; 156/345, 643, 646; 118/723; 315/111.51, 111.21

[56] References Cited

U.S. PATENT DOCUMENTS

| | | | |
|---|---|---|---|
| 3,731,047 | 5/1973 | Mullen et al. | 219/10.79 |
| 4,491,496 | 1/1985 | Laporte et al. | 156/345 |
| 4,716,572 | 12/1987 | Kuhn et al. | |
| 4,869,203 | 9/1989 | Pinkhasov | 118/723 |
| 5,004,629 | 4/1991 | Svec et al. | |
| 5,023,109 | 6/1991 | Chin et al. | |
| 5,252,892 | 10/1993 | Koshiishi et al. | |

FOREIGN PATENT DOCUMENTS

| | | |
|---|---|---|
| 0458205A3 | 11/1991 | European Pat. Off. |
| WO9219086 | 10/1992 | WIPO |

OTHER PUBLICATIONS

*Patent Abstracts of Japan*, vol. 13, No. 117 (E-731), 22 Mar. 1989 & JP-A-63 289798 (Babcock Hitachi) 28 Nov. 1988.
*Patent Abstracts of Japan*, vol. 14, No. 509 (C-0776), 7 Nov. 1990 7 JP-A-02 211245 (Toyota Motor) 22 Aug. 1990.

*Database WPI*, Week 8215, Derwent Publications, Ltd., London, GB: AN 82-29283e & JP-A-57 038 368 (Narumi Seito), 3 Mar. 1982.

*Patent Abstracts of Japan*, vol. 17, No. 222 (M-1404), 7 may 1993 & JP-A-04 356341 (Kyocera) 10 Dec. 1992.

*Patent Abstracts of Japan*, vol. 10, No. 164 (E-410) [2220], 11 Jun. 1986 & JP-A-61 016524 (Nippon Denki) 24 Jan. 1986.

*Primary Examiner*—Mark H. Paschall
*Attorney, Agent, or Firm*—Sughrue, Mion, Zinn, Macpeak & Seas, PLLC

[57] ABSTRACT

The present invention relates to an induction plasma torch of the type used in plasma deposition methods for depositing pure or doped silica when manufacturing preforms for optical fibers, the plasma torch comprising:

- a "reaction" tube inside which a plasma production zone is located;
- means for injecting reagents for forming the pure or doped silica to be deposited into the tube towards the plasma production zone;
- feed means for feeding plasma-generating gases into the tube towards the plasma production zone; and
- an induction coil surrounding the tube for supplying the energy required to form the plasma;
- wherein the tube is protected against the thermal cycles due to variations in the temperature inside the tube by means of a protective lining deposited on the inside wall of the reaction tube at the plasma production zone so as to surround the zone, the lining being made of a material based on silica, and having a thickness of less than 2 mm.

9 Claims, 1 Drawing Sheet

INDUCTION PLASMA TORCH

The present invention relates to an induction plasma torch, in particular of the type used in plasma deposition methods for depositing pure or doped silica when manufacturing preforms for optical fibers.

BACKGROUND OF THE INVENTION

Plasma torches are well known in the field of manufacturing preforms for optical fibers. Such a torch principally comprises the following elements:
- a "reaction" tube, generally based on silica, inside of which a plasma production zone is located;
- means for feeding plasma-generating gases (such as argon, oxygen, nitrogen, air, etc) into the tube;
- means for injecting (solid, liquid, or gaseous) reagents into the tube for use by the torch to perform deposition; and
- an induction coil surrounding the tube for supplying the energy required to form said plasma, the coil being powered for that purpose by a high-frequency generator.

The operating principle of such torch when manufacturing a preform for an optical fiber is as follows. In order to obtain a preform having a large final diameter (so that long lengths of optical fiber can then be drawn), a plasma torch is used to build up a preform obtained elsewhere by using a conventional method such as MCVD, OVD, VAD, etc. For that purpose, plasma-generating gases are fed into the tube as are reagents used to make up the layers to be deposited on the preform. Deposition is performed by means of the energy supplied by the induction coil coupled to the plasma production zone inside the tube.

The design of the above-described plasma torch is very simple. Such a torch is referred to as a single-flow monotube torch (since the gases are fed axially into the tube). It can be used at power levels of as much as 10 kW to 15 kW.

Other, more complex, plasma torch designs exist, and their operating principles are substantially the same as that of the single-flow monotube torch. The following are two examples of such other designs:
- the dual-flow monotube torch, in which the gases are fed axially and laterally into the reaction tube, and which can be used at power levels of as much as 25 kW to 30 kW; and
- the triple-walled torch made up of three tubes disposed coaxially with one another, the inner tube being the reaction tube inside which the plasma production zone is located; this torch is cooled by water flowing between its walls, and it can operate at power levels of as much as 150 kW.

The present invention is applicable to all types of plasma torches that are adapted to manufacturing preforms for optical fibers, and that include reaction tubes based on silica.

In all cases, the reaction tube, which is in the immediate vicinity of the plasma, is subjected to temperatures that are extremely high and that may exceed 1,000° C. (the temperature of the plasma being in the range 5,000° C. to 1,000° C.). Naturally, this is very harmful to the reaction tube which can fail mechanically (cracks appear), and then rupture.

To avoid that happening, especially when working at very high power levels, consideration has been given to using a cooling system operating by causing water to circulate in a triple-walled torch, such as the above-described torch.

Unfortunately, that has not proved to be satisfactory, because the reaction tubes of such torches still rupture in the short term.

In practice, it has been observed that induction plasma torches used continuously for many hours in manufacturing preforms for optical fibers have a maximum lifespan of about 100 hours, with a mean lifespan of a few tens of hours, in general 50 hours.

Once the reaction tube has ruptured, manufacturing must be interrupted for several hours in order to re-set the operating conditions. This reduces the production time of the device, and therefore reduces the productivity thereof. Furthermore, replacing the torch is costly. Finally, in general, by rupturing, the torch damages the preform being manufactured, which preform is therefore unusable, thereby representing a significant production loss.

It is easy to understand that it is essential to increase the lifespan of known plasma torches.

Patent Application JP 63-289798 proposes to combat thermal shocks, i.e. accidental rupturing of the reaction tube due to the fact that the plasma comes into direct contact with the wall of said tube, by depositing a lining on said wall, which lining absorbs heat by subliming. In this way, when plasma accidentally comes into contact with the lining, the material making up said lining sublimes, thereby preventing the plasma from coming into direct contact with the inside wall. That lining is adapted to torches used in laboratories for conducting tests, i.e. torches that do not operate continuously for many hours.

However, such a method is not suitable for solving the problem of reaction tube rupture, as observed after the torch has been in use for many hours. Once the material of the protective lining has sublimed after one or more accidental thermal shocks, the inside wall of the reaction tube is once again subjected to very high temperatures; in order to make the protection effective, the layer of protective lining that has been removed by subliming must be constantly reconstituted. It is easy to understand that such a method is not applicable industrially because it requires manufacturing to be shut-down completely for several hours, thereby giving rise to an unacceptable reduction in efficiency.

Another way of making that protection effective is to use a protective lining that is relatively thick, in practice at least 5 mm. But that is quite detrimental to the operation of the torch since the power of the generator connected to the induction coil must then be increased considerably in order to obtain the desired supply of energy inside the reaction tube, because of the coupling loss between the plasma and the induction coil, and therefore of the loss of generator efficiency.

Moreover, such a thick lining tends to increase statistically the risks of the plasma coming into contact with the tube, since the plasma tends to move towards the wall because said wall is less well cooled due to the fact that it is too thick.

Therefore, the method proposed in that Japanese patent application does not solve the problem posed, i.e. the problem of how to increase the lifespan of plasma torches.

OBJECTS AND SUMMARY OF THE INVENTION

An object of the invention is therefore to provide an induction plasma torch that has a lifespan that is greater than that of prior art torches.

Another object of the present invention is to provide such a torch in which it is not necessary to increase to the power level required at the high-frequency generator.

Another object of the invention is to provide such a torch that avoids repeated interruptions in production.

To these ends, the invention provides an induction plasma torch of the type used in plasma deposition methods for depositing pure or doped silica when manufacturing preforms for optical fibers, said plasma torch comprising:

a "reaction" tube inside which a plasma production zone is located;

means for injecting reagents for forming the pure or doped silica to be deposited into said tube towards the plasma production zone;

feed means for feeding plasma-generating gases into said tube towards said plasma production zone; and an induction coil surrounding said tube for supplying the energy required to form said plasma, wherein said tube is protected against the thermal cycles due to variations in the temperature inside said tube by means of a protective lining deposited on the inside wall of said reaction tube at said plasma production zone so as to surround said zone, said lining being made of a material based on silica, and having a thickness of less than 2 mm.

The invention is based on the following observation. The fact that the reaction tubes in prior art torches rupture in the short term is not due to accidental thermal shocks. Such accidental thermal shocks are relatively rare, and, in fact, they are kept well under control by controlling the flow of gases fed into the reaction tube, thereby making it possible to maintain the flame of the plasma centered therein, and therefore to prevent it from coming into contact with the walls of said tube.

Neither is such rupturing due to the fact that the wall is subjected to very high temperatures, of the order of a few thousand °C.

What the Applicant found was that such short-term rupturing of the reaction tubes used was in fact due to the repeated thermal cycles to which the inside wall of the reaction tube is subjected.

The inside wall, which surrounds the plasma, is maintained at a high temperature, greater than 1,000° C. during certain stages of use of a high-power (as much as 100 kW) torch. As explained above, such use, which is quite normal, does not create damage to the torch, such as thermal shocks. However, such high-temperature use does tend to modify the structure of the silica glass making up the reaction tube, due to a phenomenon referred to as "devitrification" or "recrystallization".

This phenomenon takes place as follows. Continuous use at a temperature greater than 1,000° C. for several hours causes the silica making up the reaction tube to be transformed into crystals referred to as "β cristobalite", i.e. it causes the silica to crystallize, at the surface of the inside wall of the reaction tube. The thickness of the layer of β cristobalite formed in this way increases with the time for which the wall is subjected to a temperature greater than 1,000° C. At this temperature, the density of the β cristobalite differs only very slightly from that of vitreous silica. Therefore, so long as this temperature is maintained, there is no danger of the tube being damaged. That is how the Applicant discovered that the problem of short torch-lifespan is not due to the fact the inner tube of the torch is subjected to high temperatures, contrary to what was thought up until then.

When the torch is cooled, either by interrupting the plasma, or as a result of the thermal cycles followed while the torch is being used, causing the temperature to decrease to less than about 250° C., this temperature being the allotropic transformation temperature at which β cristobalite is transformed into α cristobalite, a crystal phase inversion of the cristobalite is observed accompanied by a variation in density. In this way, the specific volume of the cristobalite increases by about 5% during the transformation. This high volume expansion develops very high internal tensions inside the tube, which tensions give rise to surface microcracks and crevices that act as stress concentrators in the tube. Such stresses are particularly large because, in general, the reaction tube of the torch is held at its base in a support which clamps it, and therefore creates additional stresses. It is the combination of all of these stresses which mechanically weakens the tube and then ruptures it. In fact, the tube ages prematurely.

The invention is therefore based on the discovery of the origin of the problem causing the reaction tube of the torch to rupture in the short term, arising from the fact that said tube is subjected to thermal cycles.

The invention consists in causing a lining deposited on the inside wall of the reaction tube to be subjected to the devitrification phenomenon instead of said inside wall. For that purpose, the lining must be based on silica, and it serves as a thermal screen. Given that the devitrification phenomenon is principally a surface phenomenon, a small thickness of lining is sufficient to protect the tube, so that a large thickness, which is necessary to avoid thermal shocks, and which, as explained above, is detrimental to the efficiency of the high-frequency generator, is unnecessary in order to obtain the result achieved by the invention.

Given that the protective lining is not subjected to the stresses of the mechanical support of the tube, it deteriorates at a slower rate than the inside wall of the reaction tube, which inside wall is subjected to the stresses. The lifespan of a torch of the invention is therefore increased by about the time necessary for the protective lining to deteriorate completely.

It has been observed that torches of the invention have a mean lifespan of about 600 hours, and that lifespans greater than 1,000 hours are regularly achieved.

Furthermore, the protective lining does not need to be reconstituted, because it does not sublime. Given its thickness, it adheres well to the inside wall of the tube, and there is therefore little danger of it subliming. Moreover, it is chosen to avoid subliming, in particular with respect to its latent heat of sublimation. Furthermore it is not desirable for sublimation to occur, not only to avoid having to reconstitute the protective lining, but also because that would tend to contaminate the deposits made during manufacture of the preform, thereby giving rise to a reduction in the performance levels of the resulting optical fibers (increase in their attenuation). For this reason in particular, a material based on silica has been chosen for the protective lining. A torch of the invention can therefore be used industrially without any difficulty.

Advantageously, the protective lining is made of a material based on opaque silica that has not been melted, and that is porous. This makes it possible to reduce the influence of the volume expansion due to the transformation into a cristobalite, so that the inside wall of the tube hardly suffers at all the consequences of the volume expansion.

BRIEF DESCRIPTION OF THE DRAWINGS

Other characteristics and advantages of the present invention appear in the following description of a plasma torch of the invention, and of a method of making a protective lining for such a torch, given by way of nonlimiting example and with reference to the accompanying drawings, in which.

MORE DETAILED DESCRIPTION

Figure 1:
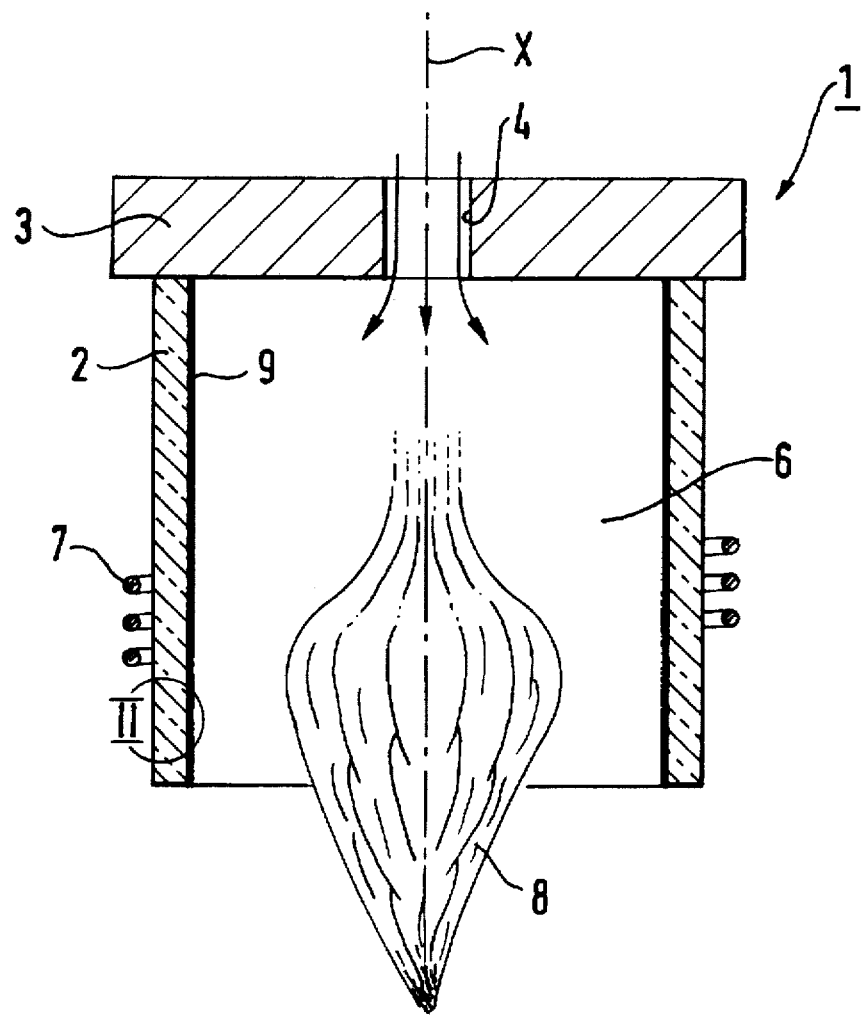
FIG. 1 is a very diagrammatic view in longitudinal section through a plasma torch of the invention.
Figure 2:
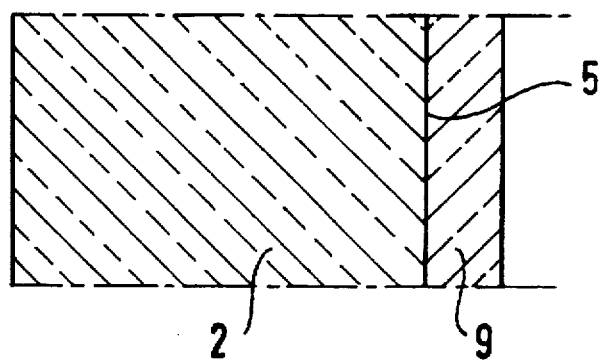
FIG. 2 is an enlarged view of a detail of FIG. 1.

FIG. 1 shows a plasma torch 1 of the invention, the torch 1 being a single-flow monotube torch. It is designed to be used in manufacturing preforms for optical fibers.

The torch includes a reaction tube 2 made of silica (or quartz) glass. Preferably, the tube 2 is made of a material that is as pure as possible and that is similar to the material to be deposited, so as not to contaminate the preform being made with any impurities, since such impurities might give rise to an increase in the attenuation of the fibers obtained from the preform.

The tube 2 is closed at one of its ends by gas feed means 3 provided with an axial opening 4 along the axis X of the tube 2. The feed means 3 serve to feed plasma-generating gas(es) (argon, oxygen, nitrogen, air, etc.) into the reaction zone 6 located inside the reaction tube 2, which gas(es) serve(s) to sustain the plasma under the effect of induction currents generated by an induction coil 7 surrounding the tube 2 and whose axis coincides with axis X, the coil 7 being connected to a high-frequency generator (not shown).

An injection device (not shown) for injecting (solid, liquid, or gaseous) reagents into the plasma is disposed inside and/or outside the reaction tube 2. Such reagents serve to make up the material to be deposited (the material being silica that is pure or doped, e.g. by means of ingredients serving to modify its refractive index).

The flame of the plasma is shown diagrammatically in FIG. 1 in which it is referenced 8.

In accordance with the invention, the inside wall 5 of the reaction tube 2 is lined over a portion of its length that corresponds to the plasma production zone 6 with a protective lining (9) that surrounds the zone. The lining 9 serves to prevent the tube 2 from being subjected directly to the thermal cycles due to variations in the temperature inside the plasma production zone 6, between the temperature of the plasma (higher than the temperature at which β cristobalite forms) and the cooling temperature (which is lower than the temperature at which allotropic transformation takes place from β cristobalite) to α cristobalite.

The lining 9 is made of a material based on silica and has a thickness of less than 2 mm, for the reasons given above.

In water-cooled torches, the reaction tube 2 is surrounded by an enclosure (not shown) through which the cooling liquid flows, the enclosure made of silica or of any other suitable material (e.g. a ceramic or a polymer material), the assembly comprising the reaction tube 2 and the enclosure then being crimped in a common support.

One possible method of making the lining 9 is now described.

First, a suspension is formed in buffered water (e.g. at pH=9) of mixture of silica and of alumina $Al_2O_3$ in respective proportions by weight of 70% and of 30%. In this way a solution referred to as a "slip" is obtained.

Then, the inside wall 5 of the reaction tube 2 is cleaned with alcohol. It must be cleaned very carefully because, in practice, cristobalite formation starts with a stable crystal nucleus being formed from accidental nuclei, such as alkaline deposits on the inside wall 5 of the tube 2, dirt due to finger marks, water marks, contaminants contained in air, etc. This phenomenon is known as "nucleation". After the nucleation stage, cristobalite starts developing, and the more the inside wall 5 of the tube is contaminated, the faster it develops.

After it has been cleaned, the tube 2 is closed off at one of its ends, and the slip is fed in via its other end, with the tube 2 being simultaneously caused to slope and to rotate (e.g. at a speed of 1 revolution per second) about its axis X, so as to coat its inside surface with a thin film of the slip.

Then, the stopper used to close off the tube 2 is removed, and the excess material deposited in this way is allowed to run out while the tube continues to be rotated.

The tube is then placed in a lathe in a ventilated place so as to dry the deposited film in ambient air while continuing to rotate the tube 2 at about 1 revolution per second about its axis X. This drying stage lasts about 5 hours.

The film is then dried in an oven for 2 hours at 300° C. This temperature is such that the deposited material does not melt, so that the resulting lining 9 is porous.

When the slip is made up of silica that is substantially pure, at at least 95% (given impurities and binders), the oven drying is performed at about 1,100° C., this temperature being lower than the annealing temperature of silica.

By using a slip, it is possible to line the tube 2 with a very thin layer, in practice not more than 2 mm thick, and preferably less than 0.5 mm thick.

Using a slip also enables the protective lining to adhere well to the inside wall 5 of the tube 2, and this is checked, once the method is finished, by injecting compressed air into the tube: the layer should not be damaged in any way. This is particularly important because, on producing plasma inside the tube 2 for igniting the torch 1, a high-amplitude blast occurs that might damage the lining 9, which is naturally highly detrimental to the lining serving its purpose properly.

Furthermore the adhesion obtained by means of the slip is just sufficient to prevent the devitrification of the lining 9 from propagating to the inside wall 5 of the tube 2.

The preceding advantages may also be obtained by using a gelling or colloidal solution of silica.

It is important that the material making up the lining 9 is based on silica, so as to avoid any contamination of the materials to be deposited by using the torch in the event of the lining decomposing.

Naturally, the present invention is not limited to the above-described embodiment.

In particular, any method may be used for depositing the protective lining on the inside wall of the reaction tube, provided that it enables the desired thickness to be deposited.

Furthermore, the starting solution used may be in any form, and not necessarily in the form of a slip, provided that the composition of the deposited lining is based on silica.

Finally, any means may be replaced with equivalent means without going beyond the ambit of the invention.

We claim:

1. An induction plasma torch of the type used in plasma deposition methods for depositing pure or doped silica when manufacturing preforms for optical fibers, said plasma torch comprising:

a reaction tube inside of which a plasma production zone is located;

a protective lining deposited on an inside wall of said reaction tube at said plasma production zone so as to surround said zone and protect said tube against thermal cycles caused by variations in temperature inside said tube, said lining being made of a material based on silica, and having a thickness of less than 2 mm;

means for injecting reagents for forming the pure or doped silica to be deposited into said tube towards the plasma production zone;

feed means for feeding plasma-generating gases into said tube towards said plasma production zone; and an induction coil surrounding said tube for supplying the energy required to form said plasma.

2. A plasma torch according to claim 1, wherein said protective lining is made of a material based on opaque silica that has not undergone any fusion, and that is porous.

3. A plasma torch according to claim 1, wherein the thickness of said protective lining is about 0.5 mm.

4. A plasma torch according to claim 1, wherein said protective lining is made of silica that is at least 95% pure, the remaining 5% corresponding in particular to impurities and to binders.

5. A plasma torch according to claim 1, wherein said protective lining is made of a mixture of silica and of alumina $Al_2O_3$, in respective proportions by weight of 70% and of 30%.

6. A method of making a protective lining for a plasma torch according to claim 1, including the following steps:

cleaning the inside surface of the reaction tube;

coating the inside wall of said tube with the material making up said protective lining, containing silica in one of aqueous, colloidal, or gelling solution so as to obtain a thin film;

drying said film in ambient air; and drying said film in an oven at a temperature that is lower than the melting point of the material making up the film.

7. A method according to claim 6, wherein said solution is a liquid slip of silica, and wherein, prior to the coating step, a first end of said tube is closed off, and said slip is fed into said tube through a second end, said first end of the tube being opened up again after the coating step.

8. A method according to claim 6, wherein, during said coating step, said tube is rotated about its own axis.

9. A method according to claim 6, wherein, during said drying steps, said tube is rotated about its own axis.

* * * * *